(12) United States Patent
Ozzie et al.

(10) Patent No.: US 8,918,478 B2
(45) Date of Patent: Dec. 23, 2014

(54) ERASURE CODED STORAGE AGGREGATION IN DATA CENTERS

(71) Applicant: Microsoft Corporation, Redmond, WA (US)

(72) Inventors: Raymond E. Ozzie, Seattle, WA (US); John D. Mehr, Kenmore, WA (US); Siddhartha Puri, Sammamish, WA (US); Samuel J. McKelvie, Seattle, WA (US); Bradley Calder, Bellevue, WA (US); Matt Pope, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 13/908,132

(22) Filed: Jun. 3, 2013

(65) Prior Publication Data

US 2013/0275390 A1 Oct. 17, 2013

Related U.S. Application Data

(63) Continuation of application No. 12/534,024, filed on Jul. 31, 2009, now Pat. No. 8,458,287.

(51) Int. Cl.
| | |
|---|---|
| *G06F 15/16* | (2006.01) |
| *G06F 15/173* | (2006.01) |
| *G06F 17/30* | (2006.01) |
| *H03M 13/00* | (2006.01) |
| *G11C 29/00* | (2006.01) |
| *G06F 11/10* | (2006.01) |
| *G06F 11/14* | (2006.01) |

(52) U.S. Cl.
CPC ...... *G06F 17/30144* (2013.01); *G06F 11/1004* (2013.01); *G06F 11/1464* (2013.01); *G06F 11/1458* (2013.01); *G06F 11/14* (2013.01)

USPC .......... 709/217; 709/238; 707/687; 714/752; 714/763

(58) Field of Classification Search
USPC .......................................................... 709/217
See application file for complete search history.

(56) References Cited

U.S. PATENT DOCUMENTS 7,165,059 B1 * 1/2007 Shah et al. ............................ 1/1
7,529,785 B1 * 5/2009 Spertus et al. ........................ 1/1

(Continued)

OTHER PUBLICATIONS

Tang et al, Sorrento: A Self-Organizing Storage Cluster for Parallel Data-Intensive Applications, UCSB Technical Report 2003-30 (2003) <http://www.cs.ucsb.edu/research/tech_reports/reports/2003-30.pdf>.*

(Continued)

*Primary Examiner* — David Lazaro
*Assistant Examiner* — Robert Shaw
(74) *Attorney, Agent, or Firm* — Bryan Webster; Kate Drakos; Micky Minhas (57) ABSTRACT

Embodiments of erasure coded storage aggregation are disclosed. The erasure coded storage aggregation includes storing a data file as erasure coded fragments in a plurality of nodes of one or more data centers. The erasure coded storage aggregation further includes monitoring an access frequency of the data file. Based on the comparison between the access frequency and a predetermined threshold, the data file is either reconstructed from the erasure coded fragments and stored in a storage node or retained as erasure coded fragments in the plurality of nodes of the one or more data centers.

17 Claims, 7 Drawing Sheets

(56) References Cited

U.S. PATENT DOCUMENTS

| | | | |
|---|---|---|---|
| 7,546,342 B2 | 6/2009 | Li et al. | |
| 7,681,105 B1* | 3/2010 | Sim-Tang et al. | 714/763 |
| 7,685,109 B1* | 3/2010 | Ransil et al. | 707/999.003 |
| 7,693,877 B1 | 4/2010 | Zasman | |
| 7,783,600 B1* | 8/2010 | Spertus et al. | 707/622 |
| 7,966,293 B1* | 6/2011 | Owara et al. | 707/654 |
| 2003/0056139 A1 | 3/2003 | Murray et al. | |
| 2004/0088331 A1* | 5/2004 | Therrien et al. | 707/200 |
| 2004/0193659 A1* | 9/2004 | Carlson et al. | 707/204 |
| 2005/0226143 A1* | 10/2005 | Barnhart et al. | 370/216 |
| 2006/0064416 A1* | 3/2006 | Sim-Tang | 707/6 |
| 2006/0161635 A1* | 7/2006 | Lamkin et al. | 709/217 |
| 2006/0230076 A1* | 10/2006 | Gounares et al. | 707/200 |
| 2006/0271530 A1* | 11/2006 | Bauer | 707/5 |
| 2007/0100913 A1* | 5/2007 | Sumner et al. | 707/204 |
| 2007/0177739 A1* | 8/2007 | Ganguly et al. | 380/277 |
| 2007/0208748 A1 | 9/2007 | Li | |
| 2007/0214314 A1 | 9/2007 | Reuter | |
| 2008/0010513 A1* | 1/2008 | Devarakonda et al. | 714/13 |
| 2008/0052328 A1 | 2/2008 | Widhelm et al. | |
| 2008/0198752 A1* | 8/2008 | Fan et al. | 370/238 |
| 2008/0221856 A1* | 9/2008 | Dubnicki et al. | 703/21 |
| 2008/0228687 A1 | 9/2008 | Devarakonda et al. | |
| 2008/0313241 A1 | 12/2008 | Li et al. | |
| 2009/0144224 A1 | 6/2009 | Phan et al. | |
| 2009/0164533 A1* | 6/2009 | Hubbard | 707/204 |
| 2009/0193064 A1* | 7/2009 | Chen et al. | 707/204 |
| 2009/0265360 A1 | 10/2009 | Bachwani et al. | |
| 2010/0192018 A1* | 7/2010 | Aiyer et al. | 714/37 |
| 2010/0199035 A1* | 8/2010 | Matsuo et al. | 711/111 |
| 2010/0251002 A1 | 9/2010 | Sivasubramanian et al. | |
| 2010/0274827 A1* | 10/2010 | Hix et al. | 707/813 |
| 2010/0293440 A1* | 11/2010 | Thatcher et al. | 714/764 |
| 2011/0029840 A1 | 2/2011 | Ozzie et al. | |
| 2011/0035548 A1* | 2/2011 | Kimmel et al. | 711/114 |

OTHER PUBLICATIONS

Tang & Yang Differentiated Object Placement and Location for Self-organizing Storage Clusters, UCSB Technical Report 2002-32 (Nov. 2002) <http://www.cs.ucsb.edu/research/tech_reports/reports/2002-32.pdf>.*

Baker et al, Measurements of a distributed file system. In Proceedings of the thirteenth ACM symposium on Operating System principles (SIGOPS) principles ACM (1991), pp. 198-212.*

Vogels, File system usage in Windows NT 4.0. In Proceedings of the 17th ACM symposium on Operating System principles (SIGOPS) ACM, (1999), pp. 93-109.*

Karlsson et al, A Framework for Evaluating Replica Placement Algorithms, HPL-2002-219, HP Labs, Aug. 8, 2002.*

Zhipeng and Dan, Dynamic Replication Strategies for Object Storage Systems, IFIP EUC Workshops 2006, LNCS 4097, Springer (2006) pp. 53-61.*

Cooley, et al., "Software-Based Erasure Codes for Scalable Distributed Storage", Proceedings of the 20th IEEE/11th NASA Goddard Conference on Mass Storage Systems and Technologies (MSS 2003), Aug. 19, 2009, 8 pages.

Dilley et al., "Globally Distributed Content Delivery", IEEE Internet Computing, Sep.-Oct. 2002, 9 pages.

Goldberg et al., "Towards an Archival Intermemory", Advances in Digital Libraries, Apr. 22-24, 1998, 10 pages.

Karlsson et al., "A Framework for Evaluating Replica Placement Algorithms", Internet Systems and Storage Laboratory, Aug. 8, 2002, 13 pages.

"Koh-i-Noor", retrieved from the internet on Aug. 19, 2009 at <<http://research.microsoft.com/en-us/projects/kohinoor/>>, 2 pages.

Kubiatowicz et al., "OceanStore: An Architecture for Global-Scale Persistent Storage", Proceedings of the Ninth International Conference on Architectural Support for Programming Languages and Operating Systems, Nov. 2000, 12 pages.

Li, et al., "Erasure Resilient Codes in Peer-to-Peer Storage Cloud", ICASSP 2006 IEEE, Aug. 19, 2009, 4 pages.

Office action for U.S. Appl. No. 12/534,024, mailed on Aug. 2, 2012, Ozzie et al., "Erasure Coded Storage Aggregation in Data Centers", 47 pages.

"PA File Sight 3.7", retrieved from the internet Aug. 19, 2009 at <<http://www.poweradmin.com/file-sight>>, 3 pages.

Tang et al., "Differentiated Object Placement and Location for Self-organizing Storage Clusters", UCSB Technical Report, Nov. 2002, 14 pages.

Tang et al., "Sorrento: A Self-Organizing Storage Cluster for Parallel Data-Intensive Applications", Proceedings of the ACM/IEEE SC2004 Conference, Nov. 6-12, 2004, 14 pages.

* cited by examiner

ERASURE CODED STORAGE AGGREGATION IN DATA CENTERS

PRIORITY APPLICATIONS

This application is a continuation of and claims priority from U.S. patent application Ser. No. 12/534,024, titled "Erasure Coded Storage Aggregation in Data Centers", filed on Jul. 31, 2009, which is herein incorporated by reference in its entirety.

BACKGROUND

"Cloud computing" refers to the access of computing resources and data via a network infrastructure, such as the Internet. The computing resources and data storage may be provided by linked data centers of the "cloud". Each of the data centers may include a plurality of servers. The servers in a typical data center may provide computation nodes and storage nodes. Computation nodes provide data processing resources, while storage nodes provide data storage and retrieval resources. However, the computation nodes may occasionally use large amounts of storage capacity to perform computation operations. Thus, a data center may set aside a significant amount of reserve storage capacity for such occasions.

Further, the storage nodes generally store duplicate copies of the same data to guard against data loss due to hardware and/or software failure. As a result, the actual storage capacity of the storage nodes of a data center may be reduced. The need to set aside reserve storage capability and storage capacity loss due to redundant data storage may reduce the operating efficiency of a data center, as well as result in the need to build new data centers that consume additional energy, financial resources, and natural resources.

SUMMARY

Described herein are erasure coded storage aggregation techniques for reducing the amount of storage capacity, or number of storage nodes, used to offer data redundancy for guarding against data loss due to hardware and/or software failure. Further, the techniques may also enable some of the computation nodes of a data center to provide storage capacity for storing third party data while simultaneously maintaining the ability to buffer their own data for the performance of computation operations. In this way, the storage capacity of existing data centers may be increased without the addition of servers, switches, and/or other hardware infrastructure. Moreover, increased efficiency in the usage of existing storage capacity of a data center may result in significant energy savings and operating cost reduction.

In at least one embodiment, the erasure coded storage aggregation includes storing a data file as erasure coded fragments in a plurality of nodes of one or more data centers. The erasure coded storage aggregation further includes monitoring an access frequency of the data file. Based on the comparison between the access frequency and a predetermined threshold, the data file is either reconstructed from the erasure coded fragments and stored in a storage node or retained as erasure coded fragments in the plurality of nodes of the one or more data centers. Other embodiments will become more apparent from the following detailed description when taken in conjunction with the accompanying drawings.

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different figures indicates similar or identical items.

DETAILED DESCRIPTION

This disclosure is directed to the implementation of erasure coded storage aggregation in one or more data centers to increasing the usage of existing storage capacity of storage nodes in the one or more data centers. In various embodiments, the implementation of erasure coded storage aggregation on a data center may reduce the amount storage capacity, or number of storage nodes, used to offer data redundancy for guarding against data loss due to hardware and/or software failure. Further, the implementation of erasure coded storage aggregation may also enable some of the computation nodes of a data center to provide storage capacity for storing third party data while simultaneously maintaining the ability to buffer their own data for the performance of computation operations. In this way, the implementation of erasure coded storage aggregation may increase the storage capacity of one or more existing data centers without the addition of servers, switches, and/or other hardware infrastructure.

Moreover, increased efficiency in the usage of existing storage capacity of the one or more data centers may result in significant energy savings and operating cost reduction, as well as alleviate expenditure for new data centers. Various examples for implementing erasure coded storage aggregation on one or more data centers in accordance with the embodiments are described below with reference to FIGS. 1-7.

Example Architecture

Figure 1:
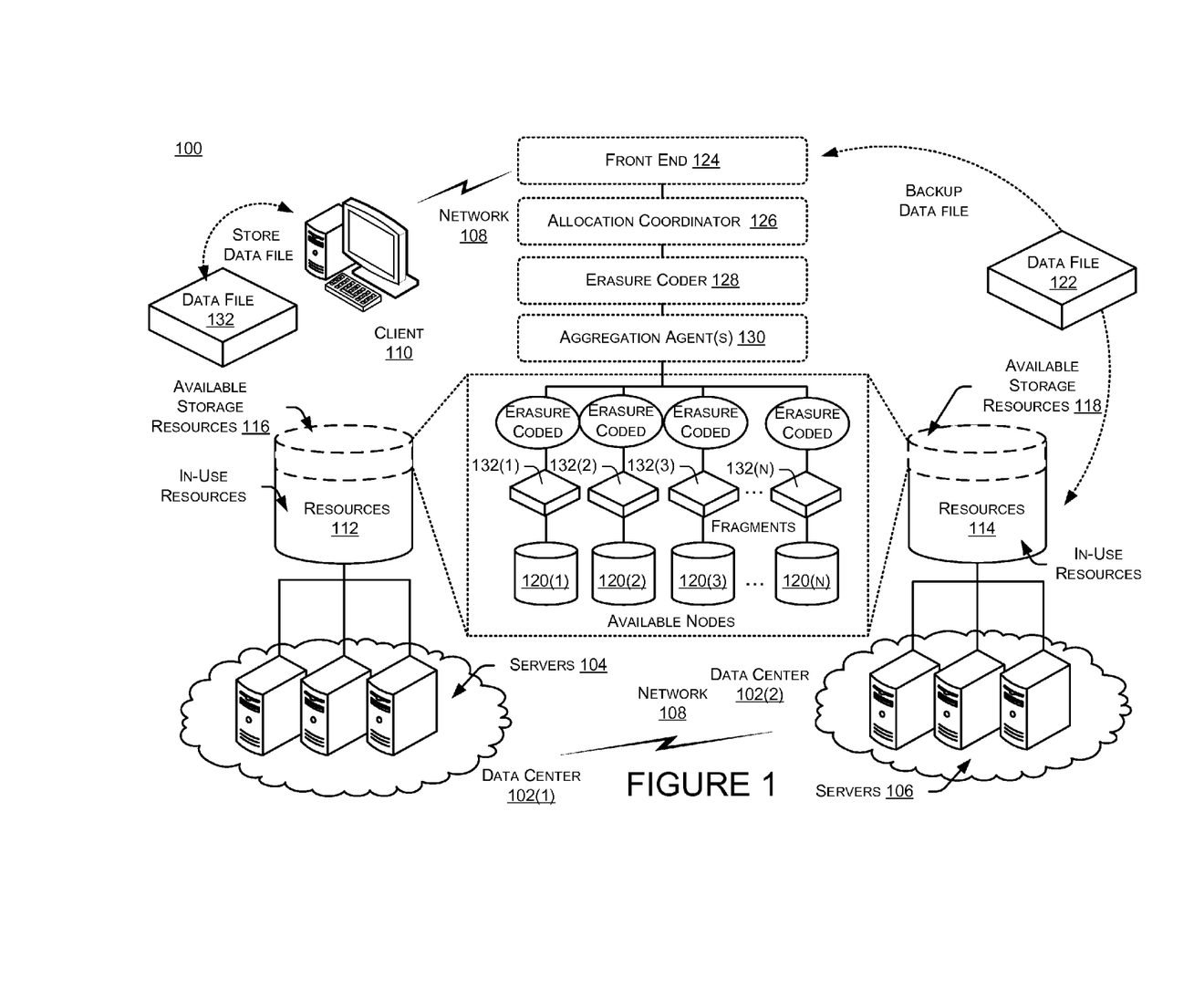
FIG. 1 is a block diagram that illustrates an example architecture that implements erasure coded storage aggregation to increase the amount of storage capacity of one or more data centers.

FIG. 1 illustrates an example architecture 100 that increases the amount of storage capacity of one or more data centers via erasure coding. In particular, this architecture 100 implements erasure coded aggregation to achieve more efficient use of storage and computation nodes in individual data centers.

The example architecture 100 may be implemented on a "computing cloud", which may include a plurality of data centers, such as the data centers 102(1) and 102(2). The data center 102(1) may be equipped with servers 104 that are interconnected via an intranet infrastructure (e.g., a local area network) within the data center 102. Likewise, the data center 102(2) may also be equipped with servers 106 that are interconnected via an intranet infrastructure within the data center 104. Moreover, the data centers 102(1) and 102(2) may be interconnected to each other and one or more clients 110 via a network infrastructure 108, such as the Internet.

Each of the servers of a data center may provide computing resources and data storage/retrieval resources to one or more clients, such as the client 110, via the network infrastructure 108. The one or more clients may include any computing device that has network access capabilities, such as a desktop computer, a laptop computer, a tablet computer, smart phone, personal digital assistants (PDAs), and other wired and wireless communication devices. As shown, the servers 104 of the data center 102(1) may provide computing and data storage/retrieval resources 112, and the servers 106 of the data center 102(2) may provide computing and data storage/retrieval resources 114.

The computing resources of the data centers, such as the data centers 102(1) and 102(2), may be organized into computation nodes. One or more computation node may reside on a server, such as a one of the servers 104. Conversely, a computation node may also span multiple servers, such as a plurality of the servers 106. Furthermore, the data storage/retrieval resources of the data centers, such as the data centers 102(1) and 102(2), may be organized into storage nodes. One or more storage nodes may reside on a server, such as one of the servers 104.

The computation nodes and the storage nodes on the data centers may enable each data center to run one or more workloads. The workloads may include the execution of one or more software applications. For example, the workloads may include the execution of line of business (LOB) software applications. In other examples, the workloads may also include database and communication applications such as a Structured Query Language (SQL) database or Microsoft® Exchange Server, as developed by the Microsoft® Corporation of Redmond, Wash. The workloads may further include virtual machines (VM), or software implementations of machines that execute program applications. In additional examples, the workloads may also include virtual hard disks (VHD).

In various embodiments, at least one of the data centers may contain available storage resources. In some of these embodiments, the available storage resources may be unfilled storage nodes that reside on at least one of the data centers. In other embodiments, the available storage resources may be storage nodes that have been intentionally set aside to ensure the proper operations of the data centers. For example, the available storage resources may include empty backup storage nodes for storing redundant data copies. In other examples, the available storage resources include the storage capacity of computation nodes maintained by these nodes to buffer their own data for the performance of computation operations.

Thus, the resources 112 of the data center 102(1) may include available storage resources 116, and the resources 114 of the data center 102(2) may include available storage resources 118. The available storage resources 116 and 118 may include a plurality of available nodes, which FIG. 1 illustrates as example available nodes 120(1), 120(2), . . . , 102(n), where the actual total number of available nodes 120(1)-102(n) may vary in different embodiments. By way of example, but not as a limitation, available nodes 102(1) and 102(2) may be part of the available storage resources 116, while available nodes 102(3) and 102(n) may be part of the available storage resources 118. In other embodiments, the available nodes 102(1)-102(n) may reside entirely on servers of a single data center (e.g., servers 104 of the data center 102(1)).

As shown in FIG. 1, erasure coded storage aggregation may be implemented to backup data stored in the storage resources of a data center into one or more available storage resources. For example, such techniques may be used to backup a data file 122 that is stored in the resources 114 into at least some of the available nodes 120(1)-120(n).

In various embodiments, erasure coded storage aggregation may be implemented based on the use of erasure coding. Erasure coding involves the breaking up of a data file, such as the data file 122, into k subset of fragments. The k subset of fragments is further transformed with the mathematical generation and incorporation of new fragments to produce N fragments. For example, but not as a limitation, a subset k of 100 fragments may be transformed into 105 fragments, where N=105. The transformation of k subset of fragments into N fragments is such that the original data file, such as the data file 122, may be reconstructed from any subset of N fragments that has the same size as the k subset. Thus, referring to the example above, each of the any subset of N fragments would have 100 fragments. In various embodiments, the N fragments may be further stored at different locations (e.g., different nodes within the same data center, different nodes on different data centers, etc.).

Thus, erasure coded storage aggregation may offer robust storage and backup of data as an N-k subset of fragments may be lost without affecting the integrity of the original data. That is, since each of the N fragments may be stored on different nodes, the failure of some number of the nodes (e.g., N-k nodes) may not impact the integrity of the original data file. This robustness is due to the fact that erasure coding enables the reconstruction of the original data file using any subset of N fragments that has the same size as the k subset. Moreover, a higher N to k ratio may increases the robustness of the storage (i.e., may create a higher recovery rate), as this means that more erasure coded fragments are available for the reconstruction of the data file.

In certain embodiments, the erasure coding of a data file, such as the data file 122, may be performed iteratively by a technique known as "hierarchal erasure coding." In hierarchal erasure coding, each of the N fragments (e.g., fragments $N_1$-$N_n$, of the original data file as described above) may be further processed in the same manner as the original data file. For example, a fragment "$N_1$" may be further broken down into m subset of fragments. The m subset of fragments is subsequently transformed to produce P fragments. Similar to describe above, the transformation of m subset of fragments into P fragments is such that the original fragment $N_1$ may be reconstructed from any subset of P fragments that has the same size as the m subset. Accordingly, rather than storing the N fragments in different nodes, the fragments, (e.g., P fragments) derived from each of the fragments $N_1$-$N_n$ may be stored in a different node. Thus, it will be appreciated that the descriptions herein related to the use and benefits of "erasure coding" may also be applicable to "hierarchal erasure coding".

In the various embodiments of backing up data using erasure coded storage aggregation, at least one data file (e.g., the data file 122) stored in the resources 114 of the data center 102(2) may be received by a front end 124. In such embodiments, the front end 124 may include hardware and/or software (e.g., APIs) that selects and transfers data files from the storage nodes of the data centers for backup.

The front end 124 may subsequently contact an allocation coordinator 126 to select nodes from the available nodes, such as the available nodes 120(1)-120(n), to store the erasure coding fragments. The allocation coordinator 126 may be an application that is part of a metadata server that is responsible for file indexing operations. This metadata server may reside in one of the data centers, although it need not. The allocation coordinator 124 may use one or more factors to determine the quantity of nodes to be selected from the available nodes, as well as select nodes from the available nodes. These factors may include the size of the data file 122, possibly amongst other factors. For example, a large data file (e.g., a 256 gigabyte file) is generally broken down into more fragments than is a smaller data file (e.g. a 128 gigabyte file). Therefore, a greater number of available nodes are used for a large file than a smaller file. Further, the quantity of available nodes used to store the erasure coding fragment may also depend on the amount of storage capacity on each available node. For example, since the erasure coding generally breaks down a data file into equal size fragments, the available node with the lowest storage capacity may limit the size of each fragment, which may in turn determine the number of available nodes desirable to perform erasure coded aggregation storage of the data file.

The quantity of available nodes used to store the erasure coding fragment may further depend on a predetermined fraction of the N fragments used for the reconstruction of the data file 122. For example, given that a data file is divided into k fragments, a larger N may mean that the backup of the data file 122 is more robust when compared to a smaller N, as the pool of available nodes that may be accessed to reconstruct the data file is larger. However, a larger N also means that more available nodes are used to store the backup for the data file 122. In various embodiments, a user may designate the N to k ratio using a user interface.

Furthermore, the factors may also include the estimated availability of each available node. For example, if a computation node frequently uses its own storage capacity (e.g., allocated hard disk space), the allocation coordinator 126 may determine that the computation node is not suitable for storing one or more backup fragments if such frequency is above a predetermined frequency threshold. In various embodiments, the predetermined frequency threshold may be the number of times in a given time period that the data file is accessed (e.g., a preset number of times per day, per week or per month, etc.).

The factors may also include the estimated health status (e.g., reliability) of each available node, as well as the proximity of each available node to other available node. For example, the allocation coordinator 126 may only select a predetermined number of available nodes from a single server or a single data center so as to reduce or eliminate the risk of simultaneous failure of an unacceptable number of nodes. In this way, the allocation coordinator 126 may provide geo-redundancy to the data file.

In some embodiments, the allocation coordinator 126 may select each node, such as the available node 120(1), to store a plurality of erasure coded fragments. While this reduces the robustness of the erasure coded aggregation storage, this may also beneficially reduce the number of available nodes used.

For example, the allocation coordinator 126 may implement the storage of a plurality of erasure coded fragment on a single selected node when there are an insufficient number of available nodes for carrying out one-to-one storage of the fragments.

Following the selection of nodes from the available nodes for storing the erasure coding fragments, the allocation coordinator 126 may cause an erasure coder 128 to perform erasure coding on the data file, such as the data file 122. In some embodiments, the erasure coder 128 may be a single application that executes on a single server (e.g., one of the servers 104). In alternative embodiments, the erasure coder 128 may be a distributed application that performs erasure coding of the data file simultaneously on a plurality of servers. Here, the servers may be located in a single data center (e.g., data center 102(1)), or across a plurality of data centers (e.g., data centers 102(1)-102(2)). The erasure coder 128 may produce a plurality of erasure coded fragments from the data file, which are illustrated in FIG. 1 as fragments 132(1)-132(n). However, the actual number of fragments 132(1)-132(n) may correspond to the number of nodes selected by the allocation coordinator 126 from the available nodes.

When the erasure coder 128 has performed the erasure code fragmentation of the data file, such as the data file 122, the allocation coordinator 126 may contact one or more aggregation agents 130. The one or more aggregation agents 130 may be background service applications that enable the allocation coordinator 126 to distribute the erasure coded fragment 132(1)-132(n) to the selected nodes for storage (e.g., nodes 120(1)-120(n)), as well as facilitate the retrieval of the erasure coded fragments 132(1)-132(n). As further described below, the one or more aggregation agents 130 may also calculate file integrity validation values, such as checksum values, for each of the erasure coded fragments.

The allocation coordinator 126 may keep track of the distribution of the erasure coded fragments to the selected nodes (e.g., some of available nodes 120(1)-120(n)). In various embodiments, the allocation coordinator 126 may maintain metadata regarding the addresses of the nodes that received the erasure coded fragments, one or more locations of the erasure coded fragments in each node, and the number of fragments stored on each node. Moreover, the allocation coordinator 126 may further maintain metadata regarding the current estimated availability and health of each node, as well other pertinent information that enables the allocation coordinator 126 to eventually retrieve a sufficient number of erasure coded fragments 132(1)-132(n) to reconstruct the data file, such as the data file 122.

The allocation coordinator 126 may also deal with contingencies that may arise during the distribution of the erasure coded fragments 132(1)-132(n) to the selected nodes. In some scenarios, the one or more selected nodes may become unavailable during the distribution process. For example, one or more aggregation agents 130 associated with the selected nodes, (e.g., some of the available nodes 120(1)-120(n)) may fail to respond to requests to store one or more of the erasure coded fragments within a predetermined time period. In another example, the one or more aggregation agents 130 may report to the allocation coordinator 126 that the one or more selected nodes lack the requisite storage capacity. Accordingly, the allocation coordinator 126 may assign the one or more affected erasure coded fragments to alternative nodes of the available nodes 120(1)-120(n), and/or selected nodes of the available nodes 120(1)-120(n) that already store erasure coded fragments. The allocation coordinator 126 may also update its metadata according to the changes in the distribution of the erasure coded fragments 132(1)-132(n).

In addition, the allocation coordinator 126 may also monitor the erasure coded fragments 132(1)-132(n) of a data file, such as the data file 122, which are stored on the selected nodes. In various embodiments, the allocation coordinator 126 may calculate a checksum value (e.g., a hash value) for each erasure coded fragment generated by the erasure coder 128. The allocation coordinator 126 may store the checksum values in its metadata. Following the distribution of the erasure coded fragments 132(1)-132(n) to the selected nodes of the available nodes 120(1)-120(n), the allocation coordinator 126 may ask the respective aggregation agents 130 to calculate and return a new checksum value for each of the erasure coded fragments 132(1)-132(n).

In such embodiments, the allocation coordinator 126 may compare the returned checksum value for each of the erasure coded fragments 132(1)-132(n) against its own calculated checksum values. Thus, an erasure coded fragment (e.g., the fragment 132(1)) may be deemed by the allocation coordinator 126 to have a valid status when the checksum values match. Conversely, the allocation coordinator 126 may deem the status of an erasure coded fragment as invalid for any other response to its checksum queries. For example, the allocation coordinator 126 may not receive a checksum value for an erasure coded fragment within a predetermined time period. In another example, the allocation coordinator 126 may receive a checksum value for an erasure coded fragment (e.g., the fragment 132(1)) that does not match the original check sum value computed by the allocation coordinator 126. In each of these instances, the allocation coordinator 126 may deem invalid the erasure coded fragment.

For each instance where an invalid status for an erasure coded fragment is found, the allocation coordinator 126 may command the responsible aggregation agent 130 to request a repair by the node storing invalid erasure coded fragment. For example, the responsible aggregation agent 130 may request an error check and correction (e.g., a parity check and data recovery) by the storing node. Following repair, the aggregation agent 130 may return another checksum value for the erasure coded fragment so that the allocation coordination 136 may once again compare the checksum values for the fragment.

Nevertheless, if the number of invalid erasure coded fragments for a data file (e.g., data file 122) reaches a predetermined minimum threshold value, the allocation coordinator 126 may initiate a reconstruction of the data file by gathering a sufficient number of the remaining valid erasure coded fragments from the respective storing nodes. The predetermined minimum threshold value may be a number that is determined based on factors such as the current estimated availability of the nodes that are storing the erasure coded fragments of the data file, the health status of such nodes, the proportion of the nodes that are storing more than one erasure coded fragments, the k to N ratio for the erasure coded fragments of the data file and/or the like. Following the reconstruction of the data file (e.g., the data file 122), the allocation coordinator 126 may once again repeat the selection of available nodes 120(1)-120(n), and use the erasure coder 128 and the aggregation agents 130 to implement erasure coded storage aggregation using the selected nodes.

As further shown in FIG. 1, erasure coded storage aggregation may also be implemented to backup or store data, such as data file 132, received from the client 110. In such embodiments, the front end 124 may include hardware and/or software that interact with the client 110 to receive the data file 132. In some embodiments, the front end 124 may include components that determine whether the data file 132 is suited for erasure coded storage. For example, data files that are accessed frequently (e.g., a continuously updated word processing document) may be ill-suited for erasure coded storage in some instances. This lack of suitability may be at least due in part to the time delay and computing resources expended to fragment and reconstruct data files, which may hinder quick and convenient access to the document. On the other hand, archived data files (e.g., old emails or retained business records) may be especially suited for erasure coded storage. This suitability may be due at least to the fact that such data files are infrequently accessed and, thus, that the time and computing costs associated with fragmentation and reconstruction of such data files is not a significant consideration or hindrance.

Accordingly, the front end 124 may include hardware and/or software components that query a user of a data file (e.g., the data file 132) to determine the frequency that the data file is likely to be accessed in the future. If this estimated frequency is below a predetermined frequency threshold, the front end 124 may trigger the erasure coding of the data file. In other embodiments, the front end 124 may predict the likely future access frequency based on the frequency of past access activities on the data file. In various embodiments, the predetermined frequency threshold may be the number of times that the data file is accessed in a given time period (e.g., a preset number of times per day, per week, per month, etc.). In additional embodiments, the front end 124 may determine whether to erasure code store a data file (e.g., data file 132) based on data file type. For example, a user may have designated to the front end 124 that email data files are to be erasure coded for storage. Thus, in at least one embodiment, with respect to the data files that are not suited and/or designated for erasure coding storage, the front end 124 may pass each data file intact for storage at a storage node (e.g., storage in the resources 112) of a suitable data center, such as the data center 102(1).

However, with respect to data files (e.g., data file 132) that are suitable and/or designated for erasure coding storage, the front end 124 may interact with the allocation coordinator 126, the erasure coder 128, and the aggregation agents 130 to erasure code the data file 132 into fragments, such as the fragments 132(1)-132(n), for storage on at least some of the available nodes 120(1)-120(n). The allocation coordinator 126 may also monitor and maintain the erasure coded fragments of the data file, as described above with respect to data file 122.

In further embodiments, the front end 124 may facilitate reconstruction and retrieval of data files that are stored as erasure coded fragments, such as the fragments 132(1)-132(n), that are stored on the selected nodes, such as available nodes 120(1)-120(n). In such embodiments, the front end 124 may receive a request to retrieve a data file. The request may be from a client, such as the client 110. The request may also be from a storage node of a data center, such as the data center 102(1), when the storage node is unable to locate the original data file 122.

The front end 124 may pass the request to the allocation coordinator 126. The allocation coordinator 126 may consult its metadata to locate the nodes, such as at least some of the available nodes 120(1)-102(n) that are storing the corresponding erasure coded fragments. The allocation coordinator 126 may further command the erasure coder 128 to contact the aggregation agents 130 responsible for the located nodes. In turn, at least some of the aggregation agents 130 may return erasure coded fragments of the requested data file. When a sufficient number erasure coded fragments have been received by the erasure coder 128, the erasure coder 128 may reconstruct the data file from the erasure coded fragments.

The erasure coder 128 may further pass the reconstructed data file to the allocation coordinator 126. The allocation coordinator 126 may note the successful reconstruction of the data file in its metadata, and pass the reconstructed data file to the front end 124. The front end 124 may subsequently deliver the reconstructed data file to the requesting client (e.g., the client 110) or the requesting storage node.

The front end 124 may also include hardware and/or software components that monitor the access and/or actual access frequency of each data file (e.g., the data file 132) that is stored as erasure coded fragments (e.g., the fragments 132(1)-132(n)) on the selected nodes, such as available nodes 120(1)-120(n). Further, the front end 124 may initiate the reconstruction of the data file from the erasure coded fragments based on an access request or the frequency of access.

In some embodiments, when the front end 124 receives a request to access the data file, the front end 124 may dynamically retrieve a sufficient number of the erasure coded fragments from storage in the available nodes to reconstruct the data file. In various embodiments, the front end 124 may complete the retrieval and reconstruction with assistance from the allocation coordinator 126, the erasure coder 128, and the aggregation agents 130, as described above.

The front end 124 may also transfer the reconstructed data file for intact storage at a storage node (e.g., storage in the resources 112) of a suitable data center, such as the data center 102(1). In this way, further access to the data file may be achieved directly from the storage node without time delay that may be associated with reconstructing the data file from erasure coded fragments.

In other embodiments, if the actual access frequency of a data file meets or is above a predetermined frequency threshold, the front end 124 may dynamically retrieve a sufficient number of the erasure coded fragments from storage in the available nodes to reconstruct the data file. In various embodiments, the predetermined frequency threshold may be the number of times in a given time period that the data file is accessed (e.g., a preset number of times per day, per week, per month, etc.). The front end 124 may complete the retrieval and reconstruction with assistance from the allocation coordinator 126, the erasure coder 128, and the aggregation agents 130, as described above.

The front end 124 may further transfer the reconstructed data file for storage at a storage node (e.g., storage in the resources 112) of a suitable data center, such as the data center 102(1). Thus, as described above, further access to the data file may be achieved directly from the storage node without any reconstruction-related time delay.

However, if the actual access frequency of a data file subsequently falls below the predetermined frequency threshold, the front end 124 may once again trigger the erasure coding of the data file. Accordingly, the front end 124 may monitor and transit each of one or more data files (e.g., the data file 132) from an intact state to a erasure coded fragments state, and vice versa, depending on the access pattern.

It will be appreciated that while erasure coded storage aggregation is described above with respect to data centers 102(1)-102(2), the techniques of erasure coded storage aggregation is application to any plurality of data centers that provide computation nodes and storage nodes. Thus, the description of erasure coded storage aggregation with respect to data centers 102(1)-102(2) is illustrative rather than limiting.

Example Components

Figure 2:
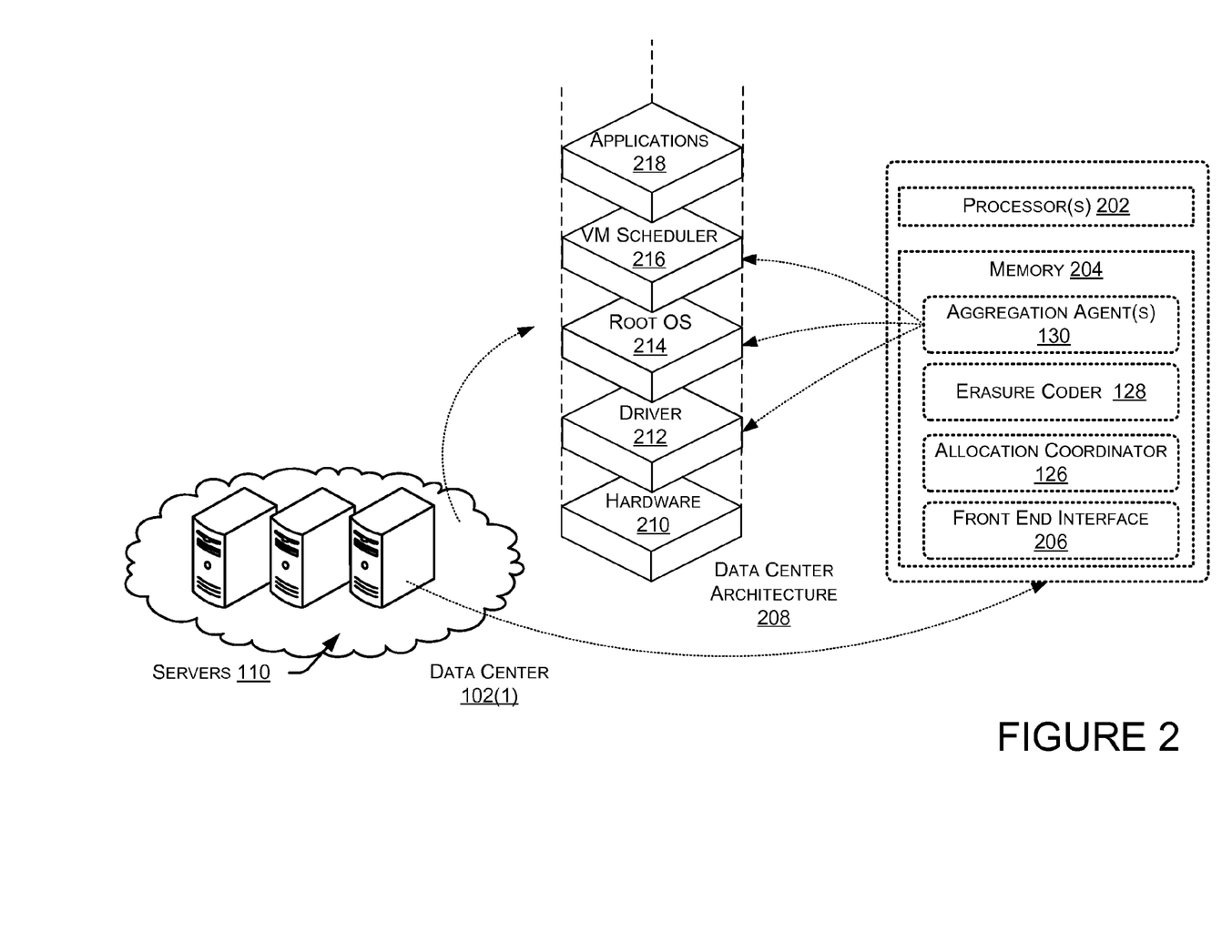
FIG. 2 is a block diagram that illustrates selected components for performing erasure coded storage aggregation.

FIG. 2 illustrates selected components for performing erasure coded storage aggregation. The components may be implemented on one or more servers, such as the servers 110 of the data centers 102(1), which include one or more processors 202 and memory 204.

The components may be stored in the memory 204. The memory 204 may include volatile and/or nonvolatile memory, removable and/or non-removable media implemented in any method or technology for storage of information, such as computer-readable instructions, data structures, program modules or other data. Such memory may include, but is not limited to, random accessory memory (RAM), read-only memory (ROM), electrically erasable programmable read-only memory (EEPROM), flash memory or other memory technology, CD-ROM, digital versatile disks (DVD) or other optical storage, magnetic cassettes, magnetic tape, magnetic disk storage or other magnetic storage devices, RAID storage systems, or any other medium which can be used to store the desired information and is accessible by a computer system. Further, the components may be in the form of routines, programs, objects, and data structures that cause the performance of particular tasks or implement particular abstract data types.

In various embodiments, the components may include the front end interface 206, the allocation coordinator 126, the erasure coder 128, and the aggregation agents 130. The front end interface 206 may be the software portion of the front end 124 and may receive data files from the client (e.g., client 110), as well provide retrieved data files to the client. Moreover, the front end interface 206 may select and transfer data files (e.g., data file 122), from the storage nodes of the data centers, such as the data center 102(1). The front end interface 206 may be a single instance program that executes on a single server, such as one of the servers 102(1).

The allocation coordinator 126, meanwhile, may be a single instance program that executes on a single server (e.g. a metadata server) or a distributed program that simultaneously executes on multiple servers. In some embodiments, the multiple servers may be located in different data centers. The allocation coordinator 126 may select available nodes, such as computation nodes and/or storage nodes, for the storage of the erasure coded fragments of data files. For example, the allocation coordinator 126 may select nodes that correspond to available storage resources 116. Further, the allocation coordinator 126 may monitor the status of the erasure coded fragments, as well as initiate data file recovery and retrieval when appropriate. In various embodiments, the allocation coordinator 126 may store metadata on the various available nodes, selected nodes, and erasure coded fragments in a metadata database that resides on a portion of the memory 204.

The erasure coder 128 may be a single instance program that executes on a single server, or a distributed program that simultaneously executes on multiple servers. The erasure coder 128 may perform erasure coding or hierarchical erasure coding on data files (e.g., the data file 132). Further, the erasure coder 128 may also reconstruct data files from erasure coded fragments.

The aggregation agents 130 may be background service applications that interface with the nodes that reside on the servers, such as the servers 110. The aggregation agents 130 may enable erasure coded fragments to be placed in the storage nodes, as well as enable erasure coded fragments to be placed in the computation nodes without interfering with the operations of the computation nodes.

As shown in FIG. 2, the placement of the one or more aggregation agents 130 for the performance of such background services may be described with respect to data center architecture 208. As shown, the data center architecture 208 typically includes, by order of stacking, a hardware layer 210, a driver layer 212, a root operating system (OS) 214, a virtual machine (VM) scheduler 216, and applications 218.

In some embodiments, the one or more aggregation agents 130 may reside on the driver layer 212 that runs on top of the hardware layer 210. In other embodiments, the one or more aggregation agents 130 may reside in the root operating system (OS) 214. In still other embodiments, the one or more aggregation agents 130 may be implemented in the VM scheduler 216.

Figure 3A:
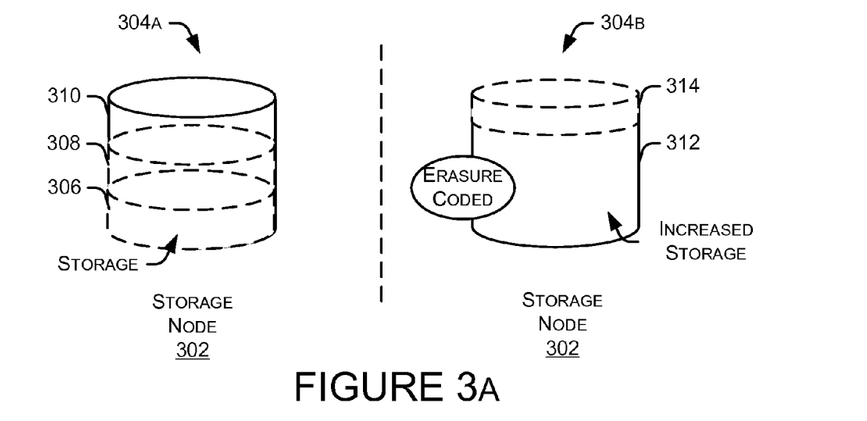
FIGS. 3a and 3b are block diagrams that illustrate the efficacy of erasure coded storage aggregation.
Figure 3B:
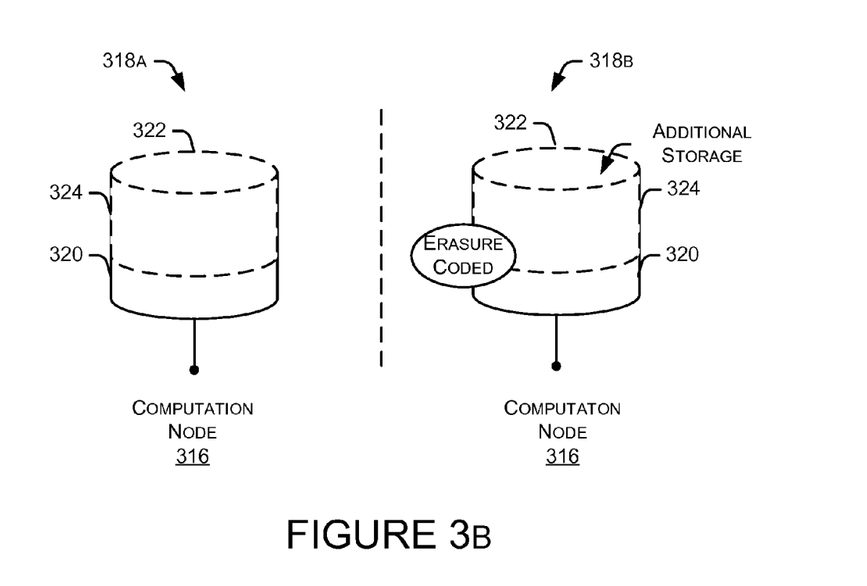

FIGS. 3a and 3b illustrate the efficacy of erasure coded storage aggregation. First, FIG. 3a illustrates the efficiency of erasure coding in creating additional storage capacity with respect to an example storage node 302. In a non-erasure coded storage aggregation scenario 304a, data files that are stored in the example storage node 302 are typically stored in triplicates to ensure maximum level of data integrity. Thus, in such a scenario, the effective storage capacity of the example storage node 302 may be effectively ⅓ (33%) of its actual storage capacity. As shown, assume portions 306-308 of the example storage node 302 are equal in size and that only portion 306 may be considered to contain saved data files, while portions 310 and 308 may contain redundant copies of the saved data files.

However, in an erasure coded storage aggregation scenario 304b, the same level of data integrity may be achieved without the use of triplicates. For example, the erasure coding each data file stored in the example storage node 302 may result in N fragments that are only 5% more numerous than the k fragments. Thus, assuming that all of the N fragments of each data file are stored on the example storage node 302, the effective storage capacity of the example storage node 302 is 95%. As shown, portion 312 may represents the 95% storage of k fragments, while portion 314 may represent the 5% of N-k fragments used by erasure coded storage aggregation to achieve data redundancy. Nevertheless, it will be appreciated that in actual implementation, the erasure coded fragments are stored on different storage nodes to maximize robustness. Thus, the scenario 304b shown in FIG. 3a is only intended to illustrate the significant advantages of erasure coded storage aggregation over triplicate data storage.

FIG. 3b illustrates the efficiency of erasure coding in creating additional storage capacity with respect to the example computation node 316. In a non-erasure coded storage aggregation scenario 318a, the example computation node 316 may normally use a portion 320 of the total allocated storage capacity 322, while the remaining storage capacity portion 324 is only occasionally used to store computation-related data.

However, with the implementation of erasure coded storage aggregation n scenario 318b, the allocation coordinator may 130 (FIG. 1) may safely store one or more erasure coded fragments, such as the one or more of the fragments 132(1)-132(n), in the storage capacity portion 324. As stated above, an original data file, such as the data file 122 (FIG. 1), may be reconstructed from any subset of N fragments that has the same size as the k subset. Thus, the loss of the one or more fragments stored in the storage capacity portion 324 may not impact the overall integrity of the data file as long as a sufficient number of erasure coded fragments is available in other nodes. In this way, the implementation of erasure coded storage aggregation may increase utilization of previously unavailable storage resources.

Example Processes

Figure 4:
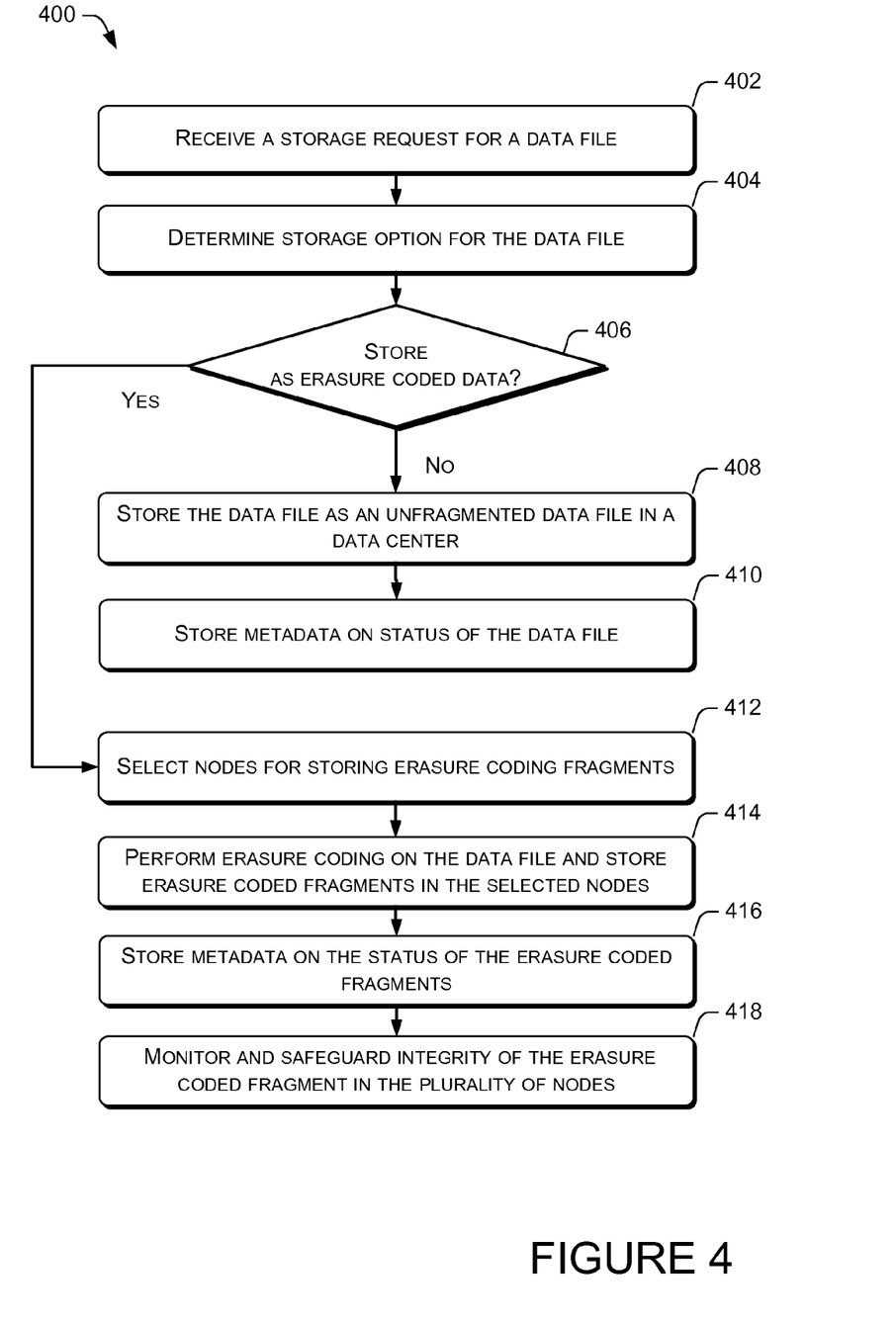
FIG. 4 is a flow diagram that illustrates an example process to store data in one or more data centers that use erasure coded storage aggregation.
Figure 5:
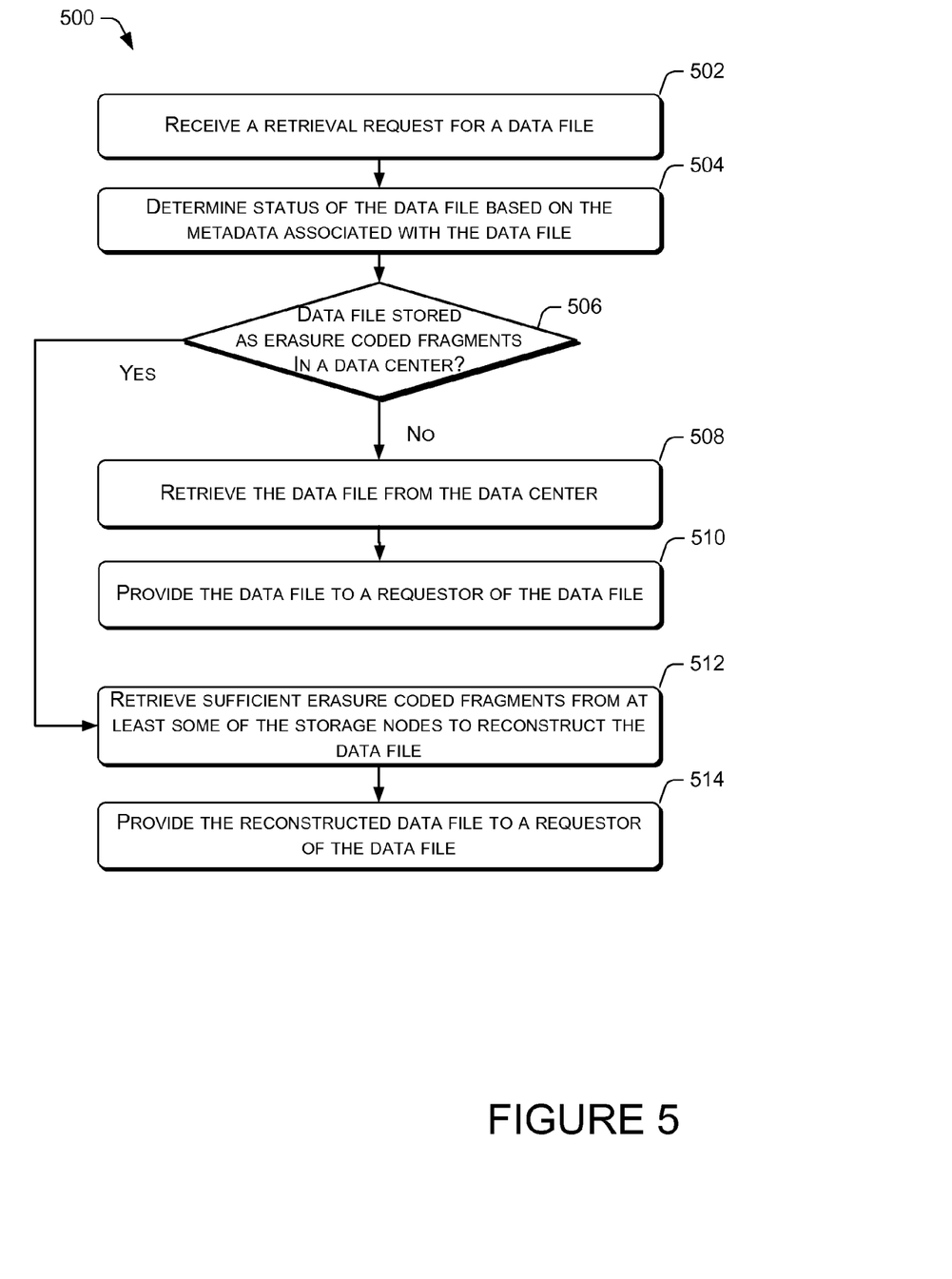
FIG. 5 is a flow diagram that illustrates an example process to retrieve data from one or more data centers that use erasure coded storage aggregation.
Figure 6:
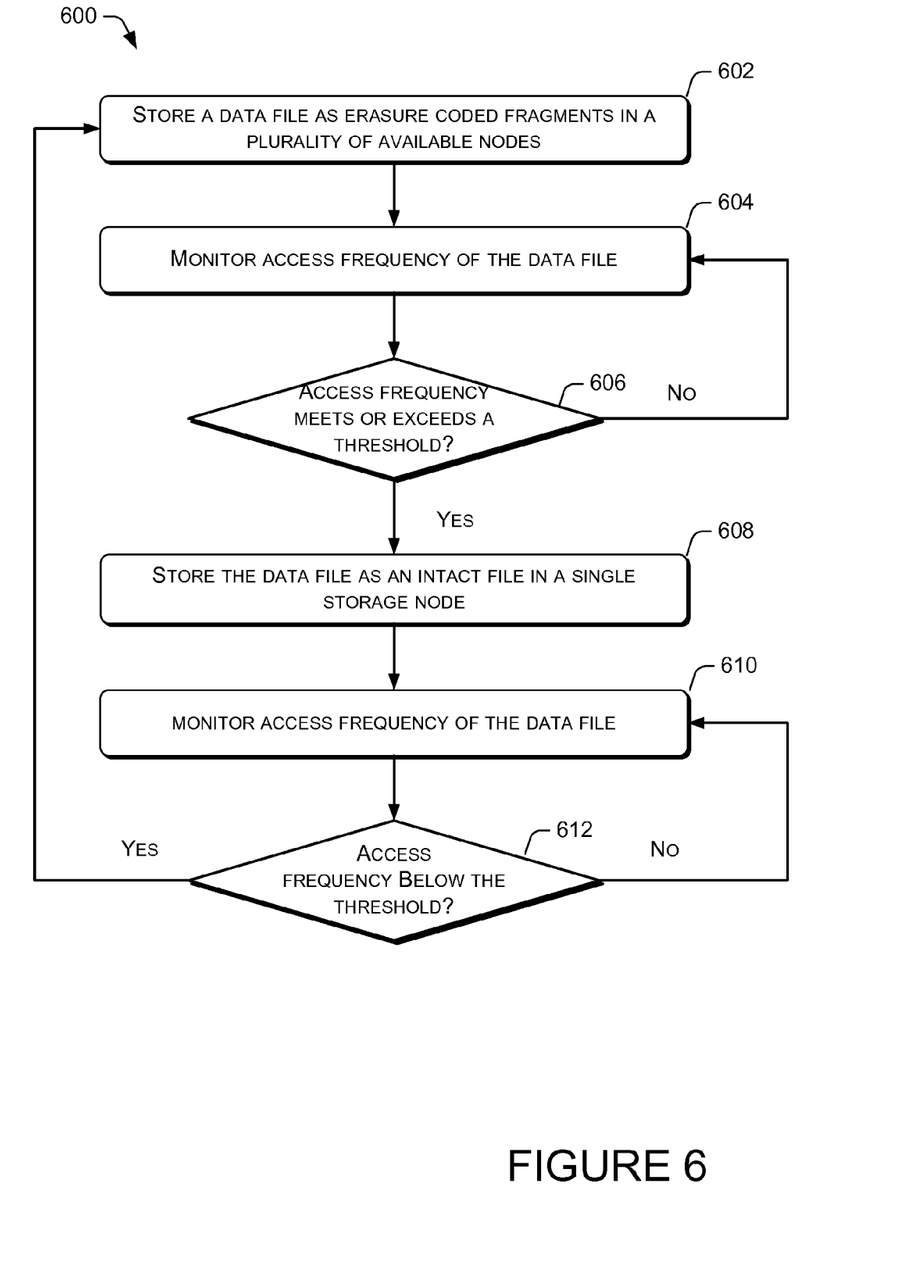
FIG. 6 is a flow diagram that illustrates an example process to transition a data file from an intact state to an erasure coded fragments state, and vice versa, based on an access pattern of the date file.

FIGS. 4-6 describe various example processes for erasure coded storage aggregation in various data centers. The order in which the operations are described in each example process is not intended to be construed as a limitation, and any number of the described blocks can be combined in any order and/or in parallel to implement each process. Moreover, the blocks in the FIGS. 4-6 may be operations that can be implemented in hardware, software, and a combination thereof. In the context of software, the blocks represent computer-executable instructions that, when executed by one or more processors, cause one or more processors to perform the recited operations. Generally, computer-executable instructions include routines, programs, objects, components, data structures, and the like that cause the particular functions to be performed or particular abstract data types to be implemented.

FIG. 4 illustrates an example process 400 to store data in one or more data centers that use erasure coded storage aggregation, in accordance with various embodiments.

At block 402, the front end 124 may receive a storage request for a data file (e.g., data file 132 or the data file 122). In some embodiments, the storage request may be from a client 110. In other embodiments, the storage request may be from a backup service application that is responsible for backing up a storage node or a computation node.

At block 404, the front end 124 may determine a storage option for the data file. In various embodiments, the front end 124 may determine the storage option based on the frequency of past access activities on the data file, predicted future access frequency, or user storage designation related to the type of the data file. For example, a user may designate data files of one or more types for erasure coded storage.

At decision block 406, if the front end 124 determines that the data file should not be stored as erasure coded data ("no" at decision block 406), the process 400 may proceed to block 408.

At block 408, the front end 124 may store the data file in a data center without using erasure coded storage. Rather, the data file may be stored intact. In various embodiments, the front end 124 may store the data file in a storage node that uses traditional data redundancy techniques (e.g., RAIDS redundant array). At block 410, the front end 124 may update the allocation coordinator 126 with the storage status of the data file. The allocation coordinator 126 may store the status of the data file as metadata.

Returning to decision block 406, if the front end 124 determines that the data file should be stored as erasure coded data ("yes" at decision block 406), the process 400 may proceed to block 412.

At block 412, the allocation coordinator 126 may determine the quantity of erasure coded fragments to effectively store the data file based on a plurality of factors as described above. The allocation coordinator 126 may then selected the desired nodes from a plurality of available nodes to store erasure coded fragments (e.g., the fragments 132(1)-132(n)) of the data file. In various embodiments, the selected nodes may include storage nodes and/or computation nodes, and the nodes may reside in one or more data centers.

At block 414, the allocation coordinator 126 may command the erasure coder 128 to erasure code the data file into the determined number of erasure coded fragments. In various embodiments, as described above, the erasure coding may also include hierarchical erasure coding. Following erasure coding of the data file, the allocation coordinator 126 may then activate one or more aggregation agents 130 to store the erasure coded fragments on the selected nodes (e.g., at least some of the nodes 120(1)-120(n)). In various embodiments, if any of the selected nodes should fail to store its assigned erasure coded fragment, the corresponding aggregation agent 130 may report back to the allocation coordinator 126, so that the allocation coordinator 126 may select alternative nodes for storing the affected erasure coded fragment.

At block 416, the allocation coordinator 126 may store metadata on the status of the erasure coded fragments. In various embodiments, the status of the erasure coded fragments may include the locations of the nodes that store the erasure coded fragments, the size of the erasure coded fragments, and the availability and health of the nodes, etc.

At block 418, the allocation coordinator 126 may monitor and safeguard the integrity of the erasure coded fragments that are stored on the nodes. In various embodiments, the allocation monitor 126 may periodically query the nodes regarding the integrity of the erasure coded fragments. In some embodiments, the allocation coordinator 126 may initiate data recovery by activating the corresponding node to repair the one or more affected erasure coded fragments if the integrity of the one or more fragments is compromised. In other embodiments, the allocation coordinator 126 may initiate recovery by reconstructing the data file, create new erasure coded fragments using the reconstructed data file, and redistribute erasure coded fragments to newly selected nodes.

FIG. 5 illustrates an example process 500 to retrieve data from one or more data centers that use erasure coded storage aggregation, in accordance with various embodiments.

At block 502, the front end 124 may receive a retrieval request for a data file. In some embodiments, the retrieval request may be from a client 110. In other embodiments, the retrieval request may be from a backup service application that is responsible for backing up a storage node or a computation node.

At block 504, the front end 124 may determine a status of the data file based on the metadata store by the allocation coordinator 126. In various embodiments, the status of the data file may include whether the data file is stored as erasure coded fragments, the location where the data file is stored, and the like.

At decision block 506, if the front end 124 determines that the data file is not stored as erasure coded fragments ("no" at decision block 506), the process 500 may proceed to block 508.

At block 508, the front end 124 may retrieve an intact copy of the data file from a storage node that uses traditional data redundancy techniques (e.g., RAIDS redundant array). At block 510, the front end 124 may provide the retrieved data file to a requestor, such as the client 110.

Returning to decision block 506, if the front end 124 determines that the data file is stored as erasure coded fragments ("yes" at decision block 506), the process 500 may proceed to block 512.

At block 512, the allocation coordinator 126 may send requests to the aggregation agents 130 to retrieve at least some of the erasure coded fragments (e.g., the fragments 132(1)-132(n)) of the data file. Once a sufficient number of the erasure coded fragments for assembling the data file is retrieved, the allocation coordinator 126 may terminate erasure coded fragment retrieval. Subsequently, the erasure coder 128 may reconstruct the data file using the erasure coded fragments.

At block 514, the allocation coordinator 126 may use the front end 124 to provide the reconstructed data file to a requestor, such as the client 110, or the backup service application for the storage node or the computation node.

FIG. 6 is a flow diagram that illustrates an example process 600 to transition a data file from an intact state to an erasure coded fragments state, and vice versa, based on an access pattern of the date file, in accordance with various embodiments.

At block 602, the front end 124 may store a data file (e.g., the data file 132) as erasure coded fragments, such as the fragments 132(1)-132(n). The fragments may be stored in a plurality of selected nodes, such as available nodes 120(1)-120(n). In various embodiments, the front end 124 may store the data file as erasure coded fragments with assistance from the allocation coordinator 126, the erasure coder 128, and the aggregation agents 130, as described above.

At block 604, the front end 124 may monitor the access frequency of the data file. In various embodiments, the predetermined frequency threshold may be the number of times in a given time period that the data file is accessed (e.g., a preset number of times per day, per week, per month, etc.).

At decision block 606, the front end 124 may determine whether the access frequency of the data file meets or exceeds a predetermined frequency threshold. If the front end 124 determines that the access frequency of the data file does not meet or exceed the predetermined frequency threshold ("no" at decision block 604), the process 600 may loop back to block 604 so that the access frequency of the data file may continue to be monitored.

However, if the front end 124 determines that the access frequency of the data file does meet or exceed the predetermined frequency threshold ("yes" at decision block 604), the process 600 may proceed to block 608.

At block 608, the front end 124 may dynamically retrieve a sufficient number of the erasure coded fragments from storage in the available nodes and reconstruct the data file. In various embodiments, the front end 124 may complete the retrieval and reconstruction with assistance from the allocation coordinator 126, the erasure coder 128, and the aggregation agents 130, as described above. Further, the front end 124 may transfer the reconstructed data file for storage at a storage node (e.g., storage in the resources 112) of a suitable data center, such as the data center 102(1). At block 610, the front end 124 may continue to monitor the access frequency of the data file.

At decision block 612, the front end 124 may determine whether the access frequency of the data file falls below the predetermined frequency threshold. If the front end 124 determines that the access frequency of the data file does fall below the predetermined frequency threshold ("yes" at decision block 612), the process 600 may loop back to block 602. Upon returning to block 602, the front end 124 may once again erasure code the data file for storage in the plurality of selected nodes.

However, if the front end 124 determines that the access frequency of the data file is not below the predetermined frequency threshold ("no" at decision block 612), the process 600 may loop back to block 610, so that the access frequency of the data file may continue to be monitored.

Example Computing Device

Figure 7:
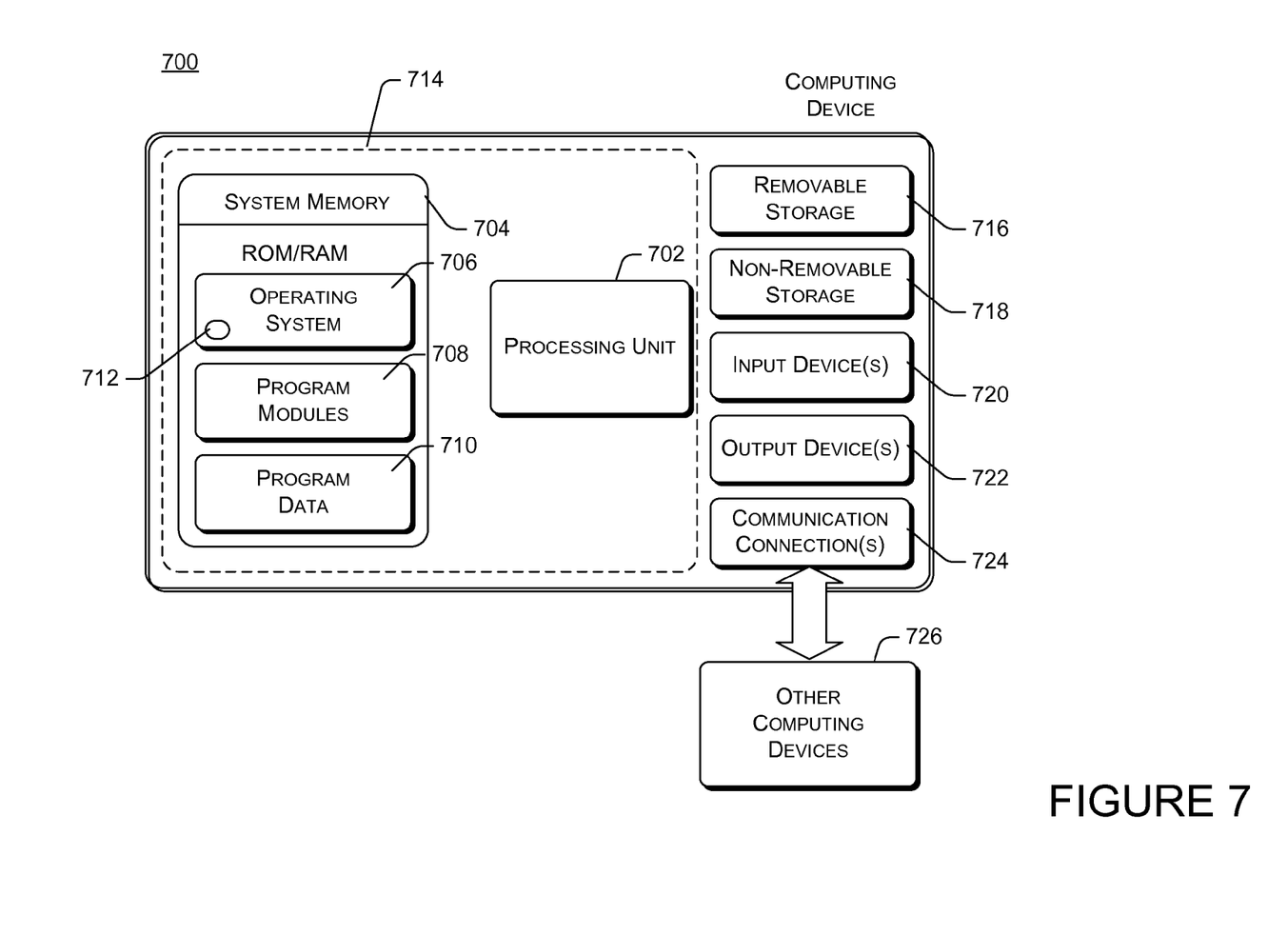
FIG. 7 is a block diagram that illustrates a representative computing device that may implement erasure coded storage aggregation.

FIG. 7 illustrates a representative computing device 700 that may implement erasure coded storage aggregation. For example, the computing device 700 may be a server, such as one of the servers 104, as described in FIG. 1. Moreover, the computing device 700 may also act as the metadata server described in the discussion accompanying FIG. 1. However, it will be readily appreciated that the techniques and mechanisms may be implemented in other computing devices, systems, and environments. The computing device 700 shown in FIG. 7 is only one example of a computing device and is not intended to suggest any limitation as to the scope of use or functionality of the computer and network architectures.

In at least one configuration, computing device 700 typically includes at least one processing unit 702 and system memory 704. Depending on the exact configuration and type of computing device, system memory 704 may be volatile (such as RAM), non-volatile (such as ROM, flash memory, etc.) or some combination thereof. System memory 704 may include an operating system 706, one or more program modules 708, and may include program data 710. The operating system 706 includes a component-based framework 712 that supports components (including properties and events), objects, inheritance, polymorphism, reflection, and provides an object-oriented component-based application programming interface (API), such as, but by no means limited to, that of the .NET™ Framework manufactured by the Microsoft® Corporation, Redmond, Wash. The computing device 700 is of a very basic configuration demarcated by a dashed line 714. Again, a terminal may have fewer components but may interact with a computing device that may have such a basic configuration.

Computing device 700 may have additional features or functionality. For example, computing device 700 may also include additional data storage devices (removable and/or non-removable) such as, for example, magnetic disks, optical disks, or tape. Such additional storage is illustrated in FIG. 7 by removable storage 716 and non-removable storage 718. Computer storage media may include volatile and nonvolatile, removable and non-removable media implemented in any method or technology for storage of information, such as computer readable instructions, data structures, program modules, or other data. System memory 704, removable storage 716 and non-removable storage 718 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by Computing device 700. Any such computer storage media may be part of device 700. Computing device 700 may also have input device(s) 720 such as keyboard, mouse, pen, voice input device, touch input device, etc. Output device(s) 722 such as a display, speakers, printer, etc. may also be included.

Computing device 700 may also contain communication connections 724 that allow the device to communicate with other computing devices 726, such as over a network. These networks may include wired networks as well as wireless networks. Communication connections 724 are some examples of communication media. Communication media may typically be embodied by computer readable instructions, data structures, program modules, etc.

It is appreciated that the illustrated computing device 700 is only one example of a suitable device and is not intended to suggest any limitation as to the scope of use or functionality of the various embodiments described. Other well-known computing devices, systems, environments and/or configurations that may be suitable for use with the embodiments include, but are not limited to personal computers, server computers, hand-held or laptop devices, multiprocessor systems, microprocessor-base systems, set top boxes, game consoles, programmable consumer electronics, network PCs, minicomputers, mainframe computers, distributed computing environments that include any of the above systems or devices, and/or the like.

The implementation of erasure coded storage aggregation on one or more data centers may reduce the amount storage capacity, or number of storage nodes, used to offer data redundancy for guarding against data loss due to hardware and/or software failure. Further, the implementation of erasure coded storage aggregation may also enable some of the computation nodes of a data center to provide storage capacity for storing third party data while simultaneously maintaining the ability to buffer their own data for the performance of computation operations. In this way, the implementation of erasure coded storage aggregative may increase the storage capacity of one or more existing data centers without the addition of servers, switches, and/or other hardware infrastructure.

CONCLUSION

In closing, although the various embodiments have been described in language specific to structural features and/or methodological acts, it is to be understood that the subject matter defined in the appended representations is not necessarily limited to the specific features or acts described. Rather, the specific features and acts are disclosed as exemplary forms of implementing the claimed subject matter.

The invention claimed is:

1. One or more device memories storing computer-executable instructions that, when executed, cause one or more processors to perform acts comprising:
   receiving a data file for storage;
   selecting a first storage option or a second storage option based in part on at least one of a past access frequency of the data file or a predicted future access frequency of the data file, the first storage option corresponding to storing the data file as an intact file, and the second storage option corresponding to storing the data file as a plurality of erasure coded fragments;
   storing the data file as the intact file in a storage node of at least one data center if the first storage option is selected; and storing the data file as the plurality of erasure coded fragments in a plurality of nodes of the at least one data center if the second storage option is selected.

2. The one or more device memories of claim 1, wherein the acts further comprise:
   after the second storage option is selected: retrieving at least some of the plurality of erasure coded fragments from the plurality of nodes; and reconstructing the data file from the at least some of the plurality of erasure coded fragments retrieved.

3. The one or more device memories of claim 2, wherein the acts further comprise providing the data file to a client device or a data center storage node after the data file is reconstructed.

4. The one or more device memories of claim 2, wherein the acts further comprise storing metadata in multiple locations across the plurality of nodes, and wherein the retrieving includes retrieving the at least some of the plurality erasure coded fragments based at least in part on the metadata.

5. The one or more device memories of claim 1, wherein the acts further comprise selecting the plurality of nodes from one or more computation nodes or one or more storage nodes.

6. The one or more device memories of claim 5, wherein each of the plurality of nodes are selected based at least in part on an estimated availability, an estimated health status or a proximity to another selected node.

7. The one or more device memories of claim 1, wherein the plurality of nodes comprises a first plurality of nodes and the plurality of erasure coded fragments comprises a first plurality of erasure coded fragments, and wherein the acts further comprise:

after the second storage option is selected:
monitoring an integrity of each of the first plurality of erasure coded fragments that are stored in the first plurality of nodes;
reconstructing the data file when the monitoring determines that a predetermined quantity of the first plurality of erasure coded fragments have an integrity that is less than a predetermined minimal threshold;
performing erasure coding on the data file to obtain a second plurality of erasure coded fragments of the data file; and
storing the second plurality of erasure coded fragments of the data file in a second plurality of nodes of the at least one data center, wherein at least one node of the second plurality of nodes differs from the first plurality of nodes.

8. A system, comprising:
one or more processors;
one or more memories;
a front end stored on the one or more memories and operable on the one or more processors to select between a first storage option or a second storage option, the first storage option corresponding to storing a data file as an intact file, and the second storage option corresponding to storing the data file as a plurality of erasure coded fragments, wherein the front end is configured to select the first storage option if an access frequency of the data file meets or exceeds a predetermined frequency threshold and the front end is configured to select the second storage option if the access frequency of the data file falls below the predetermined frequency threshold;
an allocation coordinator stored on the one or more memories and operable on the one or more processors to select a plurality of nodes to store the data file as the plurality of erasure coded fragments;
an erasure coder stored on the one or more memories and operable on the one or more processors to perform erasure coding on the data file to obtain the plurality of erasure coded fragments of the data file; and
an aggregation agent stored on the one or more memories and operable on the one or more processors to store the plurality of erasure coded fragments in the plurality of nodes.

9. The system of claim 8, wherein the allocation coordinator further commands the aggregation agent to retrieve at least some of the plurality of erasure coded fragments from the plurality of nodes, to activate the erasure coder to reconstruct the data file from the at least some of the plurality of erasure coded fragments retrieved and to provide the data file to a client device or a data storage node via the front end.

10. The system of claim 8, wherein the aggregation agent is stored in one of a driver layer, a root operating system (OS), or a virtual machine (VM) scheduler of a data center.

11. A method comprising:
receiving a data file for storage;
selecting, by one or more processors configured with executable instructions and based in part on at least one of a past access frequency of the data file or a predicted future access frequency of the data file, a first storage option or a second storage option, the first storage option corresponding to storing the data file as an intact file and the second storage option corresponding to storing the data file as a plurality of erasure coded fragments;
storing the data file as the intact file in a storage node of at least one data center if the first storage option is selected; and
storing the data file as the plurality of erasure coded fragments in a plurality of nodes of the at least one data center if the second storage option is selected.

12. The method of claim 11, further comprising:
after the second storage option is selected:
retrieving at least some of the plurality of erasure coded fragments from the plurality of nodes; and
reconstructing the data file from the at least some of the plurality of erasure coded fragments retrieved.

13. The method of claim 12, further comprising providing the data file to a client device or a data center storage node after the data file is reconstructed.

14. The method of claim 12, further comprising storing metadata in multiple locations across the plurality of nodes, and wherein the retrieving includes retrieving the at least some of the plurality erasure coded fragments based at least in part on the metadata.

15. The method of claim 11, further comprising selecting the plurality of nodes from one or more computation nodes or one or more storage nodes.

16. The method of claim 15, wherein each of the plurality of nodes are selected based at least in part on an estimated availability, an estimated health status or a proximity to another selected node.

17. The method of claim 11, wherein the plurality of nodes comprises a first plurality of nodes and the plurality of erasure coded fragments comprises a first plurality of erasure coded fragments, the method further comprising:

after the second storage option is selected:
monitoring an integrity of each of the first plurality of erasure coded fragments that are stored in the first plurality of nodes;
reconstructing the data file when the monitoring determines that a predetermined quantity of the first plurality of erasure coded fragments have an integrity that is less than a predetermined minimal threshold;
performing erasure coding on the data file to obtain a second plurality of erasure coded fragments of the data file; and
storing the second plurality of erasure coded fragments of the data file in a second plurality of nodes of the at least one data center, wherein at least one node of the second plurality of nodes differs from the first plurality of nodes.

* * * * *